United States Patent
Wilhelm

(10) Patent No.: US 7,049,767 B2
(45) Date of Patent: May 23, 2006

(54) HIGH VOLTAGE OFFSET DETECTION CIRCUIT AND METHOD

(75) Inventor: Dana Wilhelm, Temple City, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/806,688

(22) Filed: Mar. 23, 2004

(65) Prior Publication Data

US 2004/0196077 A1 Oct. 7, 2004

Related U.S. Application Data

(60) Provisional application No. 60/457,820, filed on Mar. 24, 2003.

(51) Int. Cl.
*G05F 1/00* (2006.01)
*H02H 3/20* (2006.01)
*H02M 3/335* (2006.01)

(52) U.S. Cl. .................. 315/291; 315/307; 315/209 R; 361/90; 361/91.1; 363/21.03; 363/21.01

(58) Field of Classification Search ............... 315/291, 315/307, 209 R, 224, 360, 362; 361/90, 361/91.1, 92; 363/21.03, 21.01, 56.03–56.05
See application file for complete search history.

(56) References Cited

U.S. PATENT DOCUMENTS 5,757,173 A * 5/1998 Agiman ...................... 323/282
6,614,288 B1 * 9/2003 Dagan et al. ............... 327/365

* cited by examiner

*Primary Examiner*—Tuyet Thi Vo
(74) *Attorney, Agent, or Firm*—Ostrolenk, Faber, Gerb & Soffen, LLP

(57) ABSTRACT

A high voltage offset detection circuit registers the voltage at the midpoint of a switching half-bridge to determine when the midpoint voltage reaches a given value to avoid hard-switching in the half-bridge switches. The midpoint voltage of the switching half-bridge is applied through a buffer to a MOSFET that is current limited to produce a voltage that reflects the voltage of the midpoint of the switching half-bridge. The voltage produced by the MOSFET may be supplied to a comparator with a threshold input to obtain a signal that indicates when the switches of the switching half-bridge may be turned on to avoid hard-switching. The MOSFET may be selectively enabled to detect the voltage. The buffer operates to prevent voltages being applied to the MOSFET lower than a low side return voltage to prevent shorts in the IC between the low side supply voltage and low side return. The offset detection circuit may be completely implemented on a monolithic integrated circuit with a switching half-bridge driver, or may be a separate circuit coupled to the half-bridge and external to the half-bridge driver.

17 Claims, 2 Drawing Sheets

HIGH VOLTAGE OFFSET DETECTION CIRCUIT AND METHOD

RELATED APPLICATION

This application is based on and claims benefit of U.S. Provisional Application No. 60/457,820, filed on Mar. 24, 2003, entitled Integrated High Voltage Offset Detection Circuit, to which a claim of priority is hereby made.

BACKGROUND OF THE INVENTION

1. Field of Invention

The present invention relates generally to operation of switching half-bridges, and relates more particularly to half-bridge gate drivers with high voltage offset detection.

2. Description of Related Art

High voltage half-bridge driver circuits are used in various applications such as motor drives, electronic ballasts for fluorescent lamps and power supplies. The half-bridge circuits employ a pair of totem pole connected transistors that are placed across a high voltage DC power supply. The schematic in FIG. 1 shows a simple half-bridge circuit. Transistors M1 and M2 are power devices with a midpoint connection, node "A", that provides the output that is connected to the load. Each of transistors, M1, M2, has a gate drive buffer (DRV1 and DRV2, respectively) that supplies a gate signal to turn transistors M1, M2 on or off.

In various applications, it is desirable to observe the midpoint of the half-bridge output, node A, to determine when node A has transitioned from a high state to a low state or from a low state to a high state. An exemplary application is an electronic ballast for a fluorescent lamp. A simplified schematic of an electronic ballast 20 is shown in FIG. 2. Ballast 20 supplies power to a load connected to the half-bridge at node A, which load consists of a resonant circuit including an inductor L1, a capacitor C1 and a fluorescent lamp LAMP1. During operation, ballast 20 drives transistors M1, M2 to alternately switch on and off to cause current to build in the resonant load circuit connected to node A. For example, when transistor M1 turns on, the voltage at node A is pulled to the potential of the upper DC bus voltage and current begins to build in the resonant load. When transistor M1 is switched off, the current flowing in the resonant load causes the voltage at node A to slew towards a lower potential. It is assumed that the half-bridge switches at a frequency that is greater than the resonant frequency of the load circuit. After some "dead-time" delay transistor M2 is turned on and the voltage at node A is pulled to the lower DC bus voltage which is typically zero volts. The dead-time delay prevents transistors M1, M2 from both being on at the same time, which would cause a short circuit.

The slewing of the voltage at node A, prior to the turn on of transistor M2, will take some finite amount of time to completely transition from the upper DC bus voltage to the lower DC bus voltage. Under certain conditions, the voltage at node A may not have completely transitioned to the lower potential at the time transistor M2 is turned on. In this case, transistor M2 will pull the voltage at node A to the lower DC bus voltage. This so-called "hard-switching" is a source of switching losses and will cause heating of the half-bridge transistors M1 and M2, which may eventually lead to failure of transistors M1 and M2.

The switching losses can be minimized by ensuring that the voltage at node A has completely transitioned to the lower DC bus voltage prior to the turn on of transistor M2. One way to eliminate hard-switching by ensuring complete transition of the voltage at node A is to increase the dead-time delay between the turn off of transistor M1 (M2) and the turn on of transistor M2 (M1).

Another possibility for eliminating the hard-switching is to decrease the effective capacitive loading at node A. However, these two above-mentioned alternatives represent significant drawbacks in that the speed of switching is potentially reduced, or the lamp rating is potentially reduced.

SUMMARY OF THE INVENTION

In accordance with the present invention, there is provided a circuit and method for detecting the voltage potential at a midpoint of a half-bridge switching circuit. According to one embodiment, the method is integrated into a monolithic solution for controlling a lamp ballast. The integrated circuit requires no additional external components and therefore simplifies the final application circuit. The integrated circuit can be incorporated into a high voltage half-bridge gate driver IC. An example of a high voltage half-bridge gate driver IC is the International Rectifier Corporation IR2153 chip, which includes a high voltage self-oscillating circuit for driving a half-bridge. The IR2153 provides high voltage half-bridge gate drive buffering and level translation in a monolithic integrated circuit. In the IR2153, the high side gate drive buffer DRV1 referenced to node "A", is realized in an insulated high-side well that can float up to the upper DC bus voltage potential.

According to a feature of the present invention, a signal indicating a safe threshold for switching is provided to avoid hard-switching in the half-bridge. The signal can be provided based on comparison with a programmable threshold level that can optionally be provided for specific switch parameters for specific applications.

According to another feature of the invention, a high voltage switch is provided to obtain a sense of the voltage at node A of the half-bridge. The high voltage switch can be controlled to turn on or off to measure the voltage at the half-bridge node A.

According to another feature of the invention, the voltage at the half-bridge node A is transferred to a high voltage sense circuit that is powered by a low side voltage of the half-bridge, providing a low voltage sense circuit that can withstand high voltages.

According to another feature of the present invention, the voltage measuring circuit senses voltage based on a switch turn on and a threshold comparison, and does not impact dead-time associated with alternately switching the switches in the half-bridge, and does not impact capacitive loading of the midpoint of the half-bridge circuit.

Other features and advantages of the present invention will become apparent from the following description of the invention which refers to the accompanying drawings.

DETAILED DESCRIPTION OF THE PREFERRED EMBODIMENTS

Figure 3:
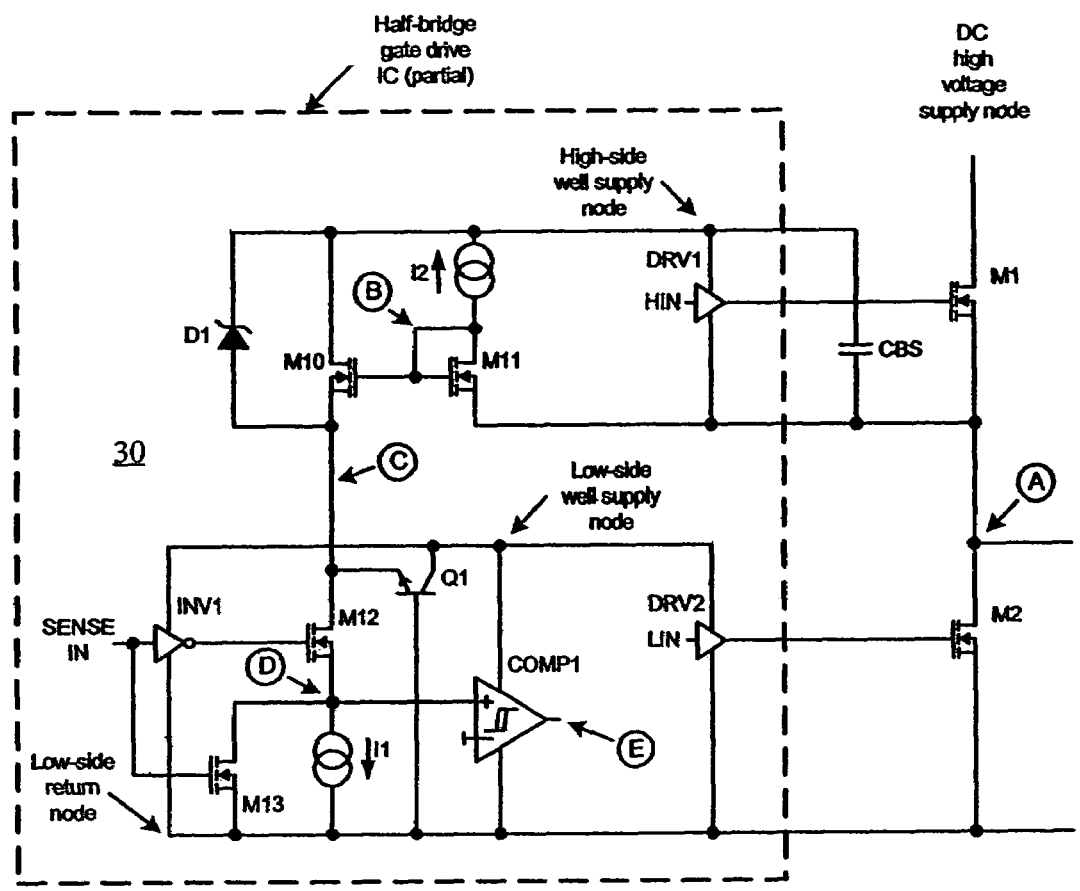
FIG. 3 is a circuit diagram of a high voltage offset detection circuit in accordance with the present invention.

Referring now to FIG. 3, a circuit diagram of a high voltage offset detection circuit is illustrated as circuit 30, enclosed within dashed lines. Voltage offset detection at node A calls for a device that is capable of withstanding high voltage, because node A may take on the voltage of the DC high voltage supply. Accordingly, transistor M12, which is a high voltage lateral diffusion MOSFET (LDMOS) transistor capable of withstanding the high voltages seen at node A. The voltage offset detection operates by sensing a voltage across transistor M12, and comparing that voltage to a threshold suitable for low side switching without switching losses that would result from hard-switching. Accordingly, transistor M12 only operates when high side transistor M1 is turned off to detect the voltage at node A, prior to the turn of transistor M2. When transistor M1 is turned off, for example, through the appropriate signal on input HIN to buffer DRV1, transistor M12 is turned on through a low logic level applied on the Sense in input to inverter INV1, which in turn supplies a high logic level to the gate of transistor M12. When transistor M1 is turned on, a high logic level is applied to the Sense in input to inverter INV1 to provide a low logic level signal to the gate of transistor M12 to turn transistor M12 off.

When high side transistor M1 is on, the voltage at node A is effectively the same as the DC high voltage supply. If transistor M12 were to be turned on while transistor M1 is turned on, transistor M12 would dissipate power, leading to unnecessary power losses. When transistor M1 is turned off, the voltage at node A may be at a level anywhere between the DC high voltage supply and the DC low side return. It should be apparent that although the DC low side return is typically a common potential at zero volts, any low side potential may be used in the half-bridge circuit and voltage offset detection according to the present invention. It is possible that the load connected to node A may cause the voltage at node A to become negative with respect to the low side return due to, for example, resonant components such as those illustrated in FIG. 2.

In accordance with the present invention, the voltage at node A is level shifted to a low side range through transistor M12, so that node D emulates the voltage at node A when switch M12 is turned on. The voltage at node D has a value ranging from that of the low side return node to VCC, or the low side well supply voltage used for driving low side transistor M2. Because transistor M12 is referenced to the low side supply voltage, the voltage at node D will not be greater than low side voltage supply VCC. Accordingly, if transistor M1 is turned off and the voltage at node A is greater than low side supply voltage VCC, the voltage at node D with transistor M12 turned on will read as low side supply voltage VCC.

Once transistor M1 is turned off and the voltage at node A falls below low side supply voltage VCC, the voltage at node D emulates the voltage at node A. The falling node D voltage may be measured to determine when the voltage at node A falls to an appropriate level to switch transistor M2 without significant switching losses, that is, to avoid hard-switching.

Figure 1:
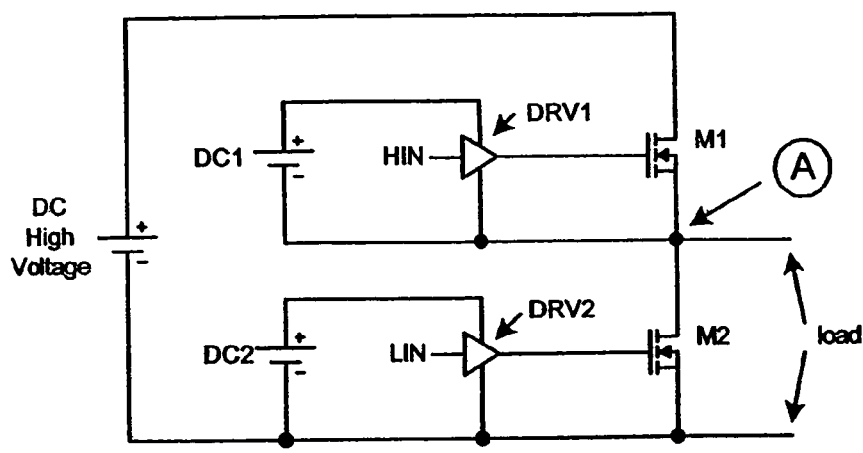
FIG. 1 is an abstract circuit diagram of the operation of a switching half-bridge circuit connected to a load.
Figure 2:
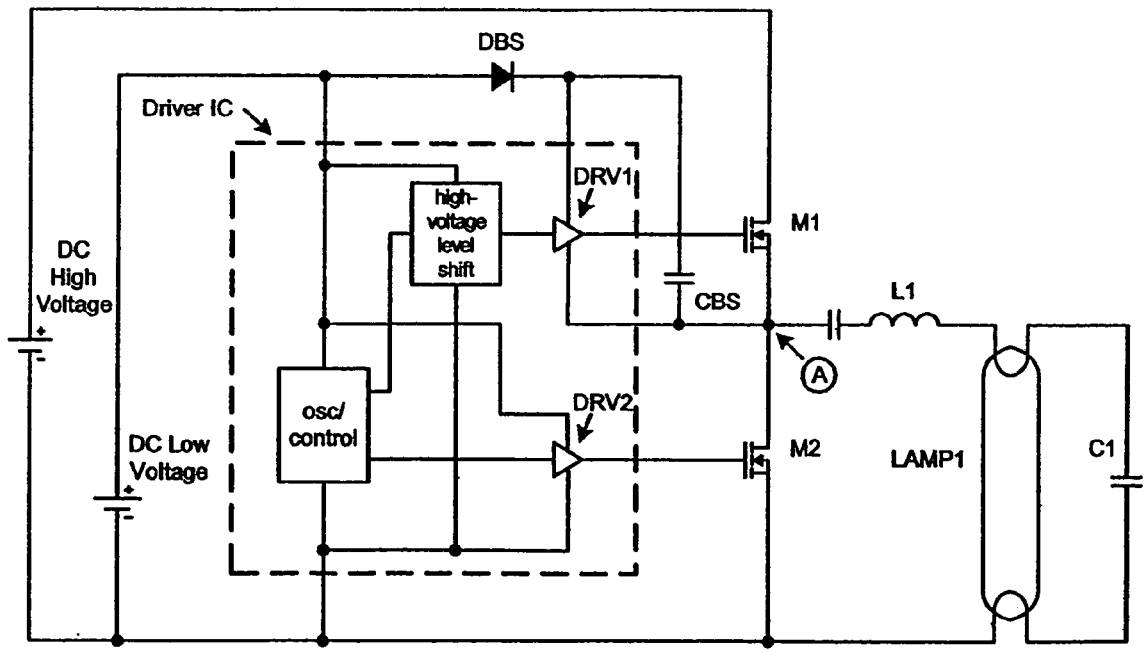
FIG. 2 is an abstract circuit diagram of an electronic ballast with a switching half-bridge connected to a lamp.

Circuit 30 illustrates a Schmidt-trigger comparator COMP1 with a non-inverting input connected to node D. Comparator COMP1 provides a comparison of the voltage at node D with a threshold voltage connected to the inverting input of comparator COMP1. Comparator COMP1 outputs a signal that can contribute to driving buffer DRV2 to provide a gate signal to transistor M2. When the output of comparator COMP1 is used to signal that the voltage at node A has reached a level that is low enough to avoid hard-switching for practical purposes, transistor M2 can be safely switched to pull the voltage at node A to the low side return voltage. The output of comparator COMP1 may be used in the control logic for driving the half-bridge driver to prevent or minimize hard-switching losses in the half-bridge transistors, as may occur in normal high speed operation, or in a fault mode. That is, by detecting the voltage at node A, the voltage offset detection circuit can respond to faults that may occur in, for example, an electronic ballast or lamp as shown in FIG. 2.

It should be apparent that comparator COMP1 is not necessary to realize the present invention, and that transistor M12 need not be referenced to the low side supply voltage to achieve the goals of the present invention. For example, transistor M12 may be referenced to a separate voltage supply to detect voltages with values that are greater than the low side supply voltage. In addition, operation of transistor M12 need not be limited to being turned on when transistor M1 is turned off, but rather can be selectively turned on to measure voltage at node A, such as in the case of a fault condition, for example.

The emulation at node D of the voltage at node A is achieved according to the voltage offset detection circuit 30 as follows. When the Sense In input to inverter 1 is set to a high logic level, a low logic level is supplied to the gate of transistor M12 through inverter INV1. Optionally, the gate of transistor M12 can be connected to zero volts, or directly to a logic low level. The Sense In input is also applied to the gate of transistor M13, which turns on to pull the voltage at node D of transistor 12 to a low side voltage return level. In this state, transistor M12 is off and no current flows in the drain of transistor M12, thereby avoiding dissipation losses in transistor M12 when transistor M1 is turned on.

Voltage offset detection at node A begins with the Sense In input being pulled or set to a low logic level, so that the gate of transistor M12 is set to a high logic level, or VCC, through the operation of inverter INV1. Transistor M13 is also turned off so that node D is set to the low side voltage return level by the operation of current source I1. Note that there may be a small delay between the turn off of transistor M13 and the turn on of transistor M12 because of the signal flow through inverter INV1.

When transistor M12 turns on, it is assumed that the voltage magnitude at node C is greater than the voltage magnitude at the low side return, so that current will flow in the turned on transistor M12 from node C to node D. Transistor M12 is connected as a source follower and, when turned on, the voltage at node D rises to approximately the same voltage magnitude as that at node C, since the voltage magnitude at node C is greater than the voltage magnitude of the low side return. Current source I1 limits the amount of current flowing in transistor M12, as determined by the magnitude of the current in current source I1, so that a voltage at node D is realized, which is equivalent to the voltage at node C.

If the voltage at node C is greater than the voltage magnitude of low side supply voltage VCC, the voltage at node D rises to the low side supply voltage VCC. As the voltage at node D approaches VCC, minus the turn on threshold voltage of transistor M12, transistor M12 enters a saturation region of operation with a current magnitude equal to that supplied by current source I1. Operation in the saturation region limits the voltage at node D to a voltage level lower than that of low side supply voltage VCC. The difference of the voltage magnitude between the voltages at node C and node D appears across transistor M12, and may be a high voltage level. However, because M12 is a high voltage device, such as a lateral diffusion metal oxide semiconductor (LDMOS), the demand for handling high voltages is met.

The voltage at node C in circuit 30 is provided by source follower connected transistor M10. The voltage at node C is equal to the voltage at node B minus the turn on threshold of transistor M10. The voltage at node B is derived from the diode connected transistor M11. Transistor M11 has a source/body connection to node A. The voltage at the gate/drain connection of transistor M11, node B, is pulled high by current source I2. Therefore, the voltage at node B is equal to the voltage at node A plus the turn on threshold of transistor M11. The magnitude of current sources I1 and I2 are preferably chosen to be equal and transistors M10 and M11 are matched in their characteristics. Accordingly, equal current flows in the drains of transistors M10 and M11, and the turn on threshold of M10 and M11 are equivalent. By extrapolation, it can be seen that the voltage at node C is equivalent to the voltage at node A in these circumstances. Because the high side well supply is at approximately an equal voltage to that at node A, there is a possibility that high voltage might appear across transistor M10. Accordingly, diode D1 is provided to transistor M10 as a zener clamp that limits the maximum voltage that will appear across transistor M10. Transistor M10 need not be capable of withstanding high voltage in these circumstances, and can be chosen to have a lower rating to reduce size and cost of circuit 30.

The function of the combination of transistors M10, M11, diode D1 and current source I2 avoids the direct connection of the drain of transistor M12 to node A. In the operation of the half-bridge circuit, it is possible that the voltage at node A may be pulled below the potential of the low side return voltage, causing parasitic NPN transistor Q1 to turn on, effectively shorting the low side supply voltage to the low side return. Transistor Q1 is a parasitic NPN transistor that is part of the monolithic structure of the half-bridge gate driver IC. Accordingly, the drain of transistor M12 must be protected from being pulled below the potential of the low side return node to avoid shorting the low side supply voltage to the low side return. The combination of transistors M10, M11, diode D1 and current source I2 provide a buffer for the voltage supplied from node A to the drain of transistor M12 to avoid this problem. Accordingly, the voltage on the drain of transistor M12 is maintained to be approximately between the low side supply and the low side return to detect the voltage offset at node A.

It should be apparent that a number of other possible realizations of the high voltage offset detection circuit may be achieved in keeping with the disclosure of the present invention. For example, other circuits may be employed to transfer a voltage level from node A to the drain of transistor M12 while avoiding shorting the low side supply voltage. In addition, high voltage devices other than LDMOS transistor M12 may be employed to obtain a level shifted voltage offset detection circuit. Although circuit 30 according to the present invention is preferably integrated on a monolithic structure of a half-bridge gate driver IC, circuit 30 can also be realized as an independent circuit external to the half-bridge gate driver IC.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A voltage offset detection circuit for detecting a voltage at a midpoint of a switching half-bridge, the circuit comprising:
   a high voltage device coupled to the midpoint of the switching half-bridge to register a detection voltage related to the voltage at the midpoint of the switching half-bridge; and
   a voltage detection output circuit coupled to the high voltage device for receiving the detection voltage and outputting a signal to contribute to operation of the half-bridge circuit to avoid hard-switching based on the voltage at the midpoint of the half-bridge circuit, further wherein the high voltage device is referenced to a switching half-bridge low voltage return reference.

2. The circuit according to claim 1, further comprising a buffer circuit coupled between the high voltage device and the midpoint of the switching half-bridge for maintaining a voltage applied to the high voltage device above the low voltage return reference.

3. The circuit according to claim 1, further comprising a switch coupled between the high voltage device and the low voltage return reference to maintain the high voltage device at the low voltage return reference when the switch is on.

4. The circuit according to claim 1, further comprising a current source coupled between the high voltage device and the low voltage return reference for limiting current supplied through the high voltage device when the high voltage device is turned on.

5. A method for detecting voltage offset in a switching half-bridge for an electronic ballast comprising utilizing the device of claim 1.

6. An electronic ballast, comprising the offset voltage detection circuit of claim 1.

7. The circuit according to claim 1, wherein the high voltage device is a MOSFET.

8. The circuit according to claim 7, further comprising an inverter coupled to a gate of the MOSFET for switching the MOSFET on and off.

9. The circuit according to claim 1, further comprising a control signal coupled to the high voltage device for operating the high voltage device to register the detection voltage.

10. The circuit according to claim 9, wherein the control signal is operable to actuate the high voltage device when a high side switch in the switching half-bridge is turned off.

11. A voltage offset detection circuit for detecting a voltage at a midpoint of a switching half-bridge, the circuit comprising:
    a high voltage device coupled to the midpoint of the switching half-bridge to register a detection voltage related to the voltage at the midpoint of the switching half-bridge; and
    a voltage detection output circuit coupled to the high voltage device for receiving the detection voltage and outputting a signal to contribute to operation of the half-bridge circuit to avoid hard-switching based on the voltage at the midpoint of the half-bridge circuit, further comprising a comparator having an input coupled to the high voltage device, whereby an output of the comparator indicates when the voltage at the midpoint of the switching half-bridge has reached a value to avoid hard-switching when a low side switch in the switching half-bridge is turned on.

12. A method for detecting a voltage offset at a midpoint of a switching half-bridge, comprising:
   coupling a high voltage device to the midpoint of the switching half-bridge to register a detection voltage on the high voltage device related to the voltage offset at the midpoint of the switching half-bridge; and
   supplying a signal based on the detection voltage registered on the high voltage device to indicate when the voltage at the midpoint of the switching half-bridge has attained a value sufficient to avoid hard-switching when a low side switch of the switching half-bridge is turned on, further comprising actuating the high voltage device to register the detection voltage when a high side switch in the switching half-bridge is turned off.

13. The method according to claim 12, further comprising buffering the high voltage device from the voltage at the midpoint of the switching half-bridge.

14. The method according to claim 12, further comprising preventing a voltage applied to the high voltage device from attaining a level lower than a common reference to which the high voltage device is coupled.

15. The method according to claim 12, further comprising providing a MOSFET as the high voltage switching device.

16. The method according to claim 12, further comprising limiting a current through the high voltage device to register the detection voltage.

17. A circuit for detecting conditions in a switchng half-bridge to prevent hard-switching, comprising:
   a high voltage device referenced between a high voltage of the switching half-bridge and a low side return voltage of the switching half-bridge for registering a detection voltage at a midpoint of the switching half-bridge; and
   a detection voltage level detector coupled to the high voltage device for indicating when the detection voltage registered on the high voltage device reaches a predetermined value to indicate or avoid a fault condition, further wherein the high voltage device is selectively enabled to register the detection voltage.

* * * * *